US012564072B2

(12) United States Patent
Urata

(10) Patent No.: US 12,564,072 B2
(45) Date of Patent: Feb. 24, 2026

(54) SEMICONDUCTOR DEVICE AND METHOD FOR MANUFACTURING THE SAME

(71) Applicant: Mitsubishi Electric Corporation, Tokyo (JP)

(72) Inventor: Atsushi Urata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 602 days.

(21) Appl. No.: 17/936,447

(22) Filed: Sep. 29, 2022

(65) Prior Publication Data

US 2023/0163049 A1     May 25, 2023

(30) Foreign Application Priority Data

Nov. 24, 2021     (JP) ................................. 2021-190508

(51) Int. Cl.
| | |
|---|---|
| *H01L 23/495* | (2006.01) |
| *H01L 21/56* | (2006.01) |
| *H01L 23/00* | (2006.01) |
| *H01L 23/31* | (2006.01) |

(52) U.S. Cl.
CPC ........ *H01L 23/49513* (2013.01); *H01L 21/56* (2013.01); *H01L 23/3107* (2013.01); *H01L 23/49586* (2013.01); *H01L 24/48* (2013.01); *H01L 24/32* (2013.01); *H01L 24/73* (2013.01); *H01L 2224/32245* (2013.01); *H01L 2224/48137* (2013.01); *H01L 2224/48175* (2013.01); *H01L 2224/73265* (2013.01)

(58) Field of Classification Search
CPC ........... H01L 23/49513; H01L 23/3107; H01L 23/49586; H01L 21/56; H01L 24/48; H01L 24/32; H01L 24/73; H01L 2224/32245; H01L 2224/48137; H01L 2224/48175; H01L 2224/73265
See application file for complete search history.

(56) References Cited

U.S. PATENT DOCUMENTS

2004/0145043 A1   7/2004  Hayashi et al.
2005/0067719 A1*  3/2005  Hayashi ............ H01L 23/49575
                                                            257/E23.092

(Continued)

FOREIGN PATENT DOCUMENTS

JP        2004-063688 A      2/2004
JP        2017-135310 A      8/2017

(Continued)

OTHER PUBLICATIONS

Machine English Translation of CN 203085515, Eun et al., Semiconductor Package, published Jul. 24, 2013.*

(Continued)

*Primary Examiner* — Peniel M Gumedzoe
(74) *Attorney, Agent, or Firm* — Studebaker Brackett PLLC

(57)          ABSTRACT
A semiconductor device according to the present disclosure includes: a lead frame having a plurality of die pad portions electrically independent from each other; a power semiconductor element provided on each of the die pad portions; a wire electrically connecting the power semiconductor element and the lead frame; an epoxy-based resin provided on at least a part of the lead frame; and a sealing resin covering at least each of the die pad portions, the power semiconductor element, the wire, and the epoxy-based resin.

14 Claims, 14 Drawing Sheets

(56) References Cited

U.S. PATENT DOCUMENTS

| | | |
|---|---|---|
| 2007/0132112 A1 | 6/2007 | Ozaki et al. |
| 2009/0278248 A1* | 11/2009 | Matsumura ............. H01L 24/32 |
| | | 257/E23.101 |
| 2013/0069213 A1* | 3/2013 | Sohn ................. H01L 23/49537 |
| | | 257/668 |
| 2021/0175141 A1 | 6/2021 | Kajihara et al. |

FOREIGN PATENT DOCUMENTS

| | | |
|---|---|---|
| JP | 2021-145037 A | 9/2021 |
| WO | 2013/124940 A1 | 8/2013 |
| WO | 2017/154072 A1 | 9/2017 |

OTHER PUBLICATIONS

An Office Action; "Notice of Reasons for Refusal," mailed by the Japanese Patent Office on Oct. 22, 2024, which corresponds to Japanese Patent Application No. 2021-190508 and is related to U.S. Appl. No. 17/936,447; with English language translation.

An Office Action mailed by the German Patent Office on Oct. 31, 2023, which corresponds to German Patent Application No. 10 2022 129 699.7 and is related to U.S. Appl. No. 17/936,447.

An Office Action; "Notice of Reasons for Refusal," mailed by the Japanese Patent Office on Apr. 1, 2025, which corresponds to Japanese Patent Application No. 2021-190508 and is related to U.S. Appl. No. 17/936,447; with English language translation.

\* cited by examiner

F I G.  1
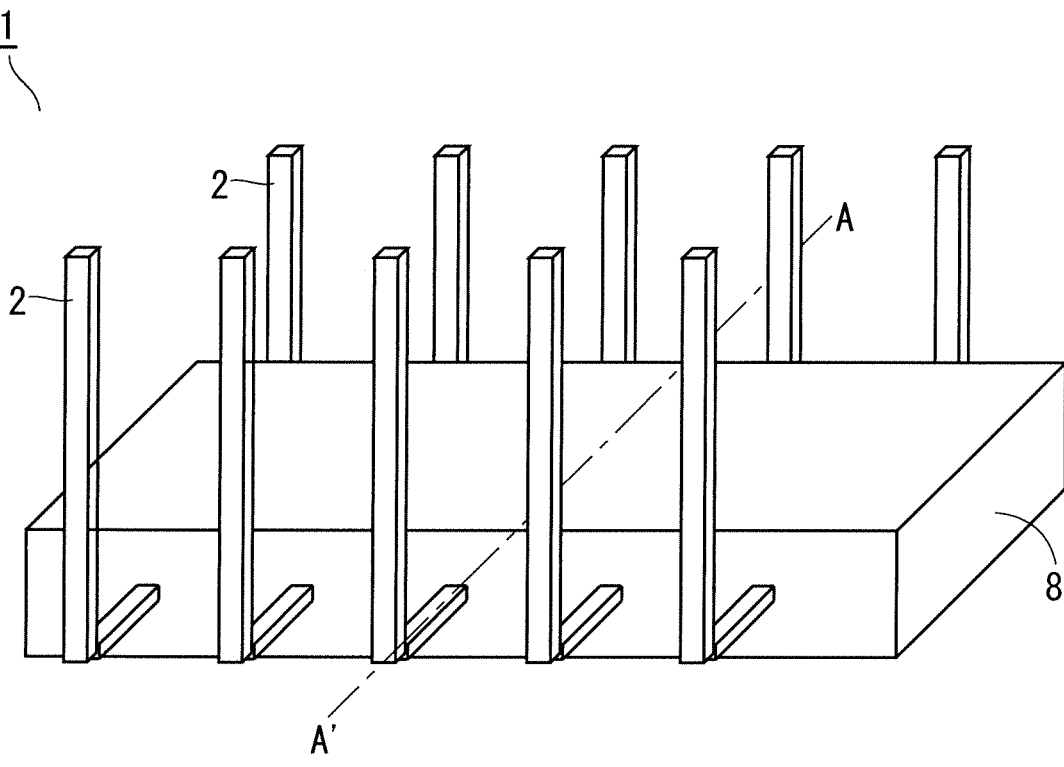

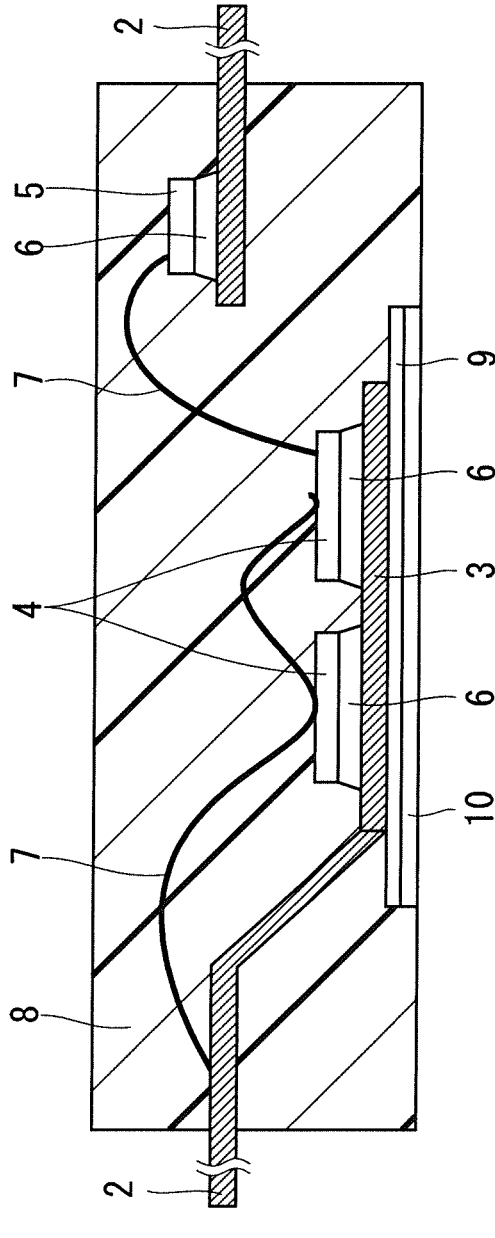
F I G. 2

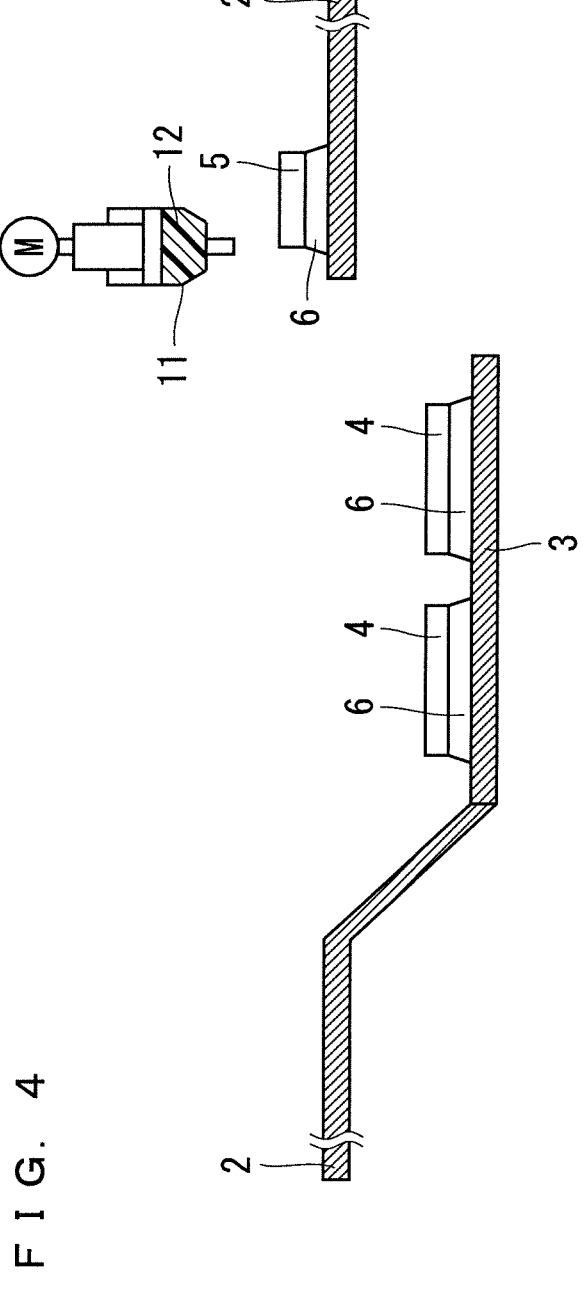
F I G. 4

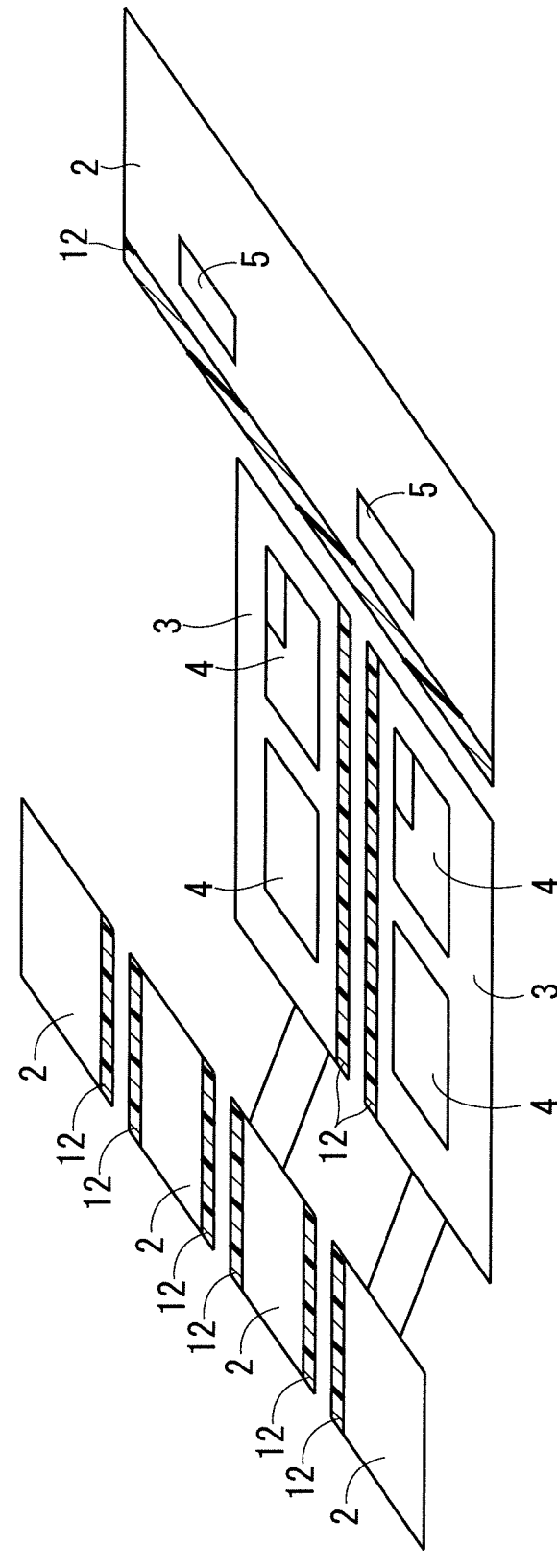
F I G. 5

F I G. 6
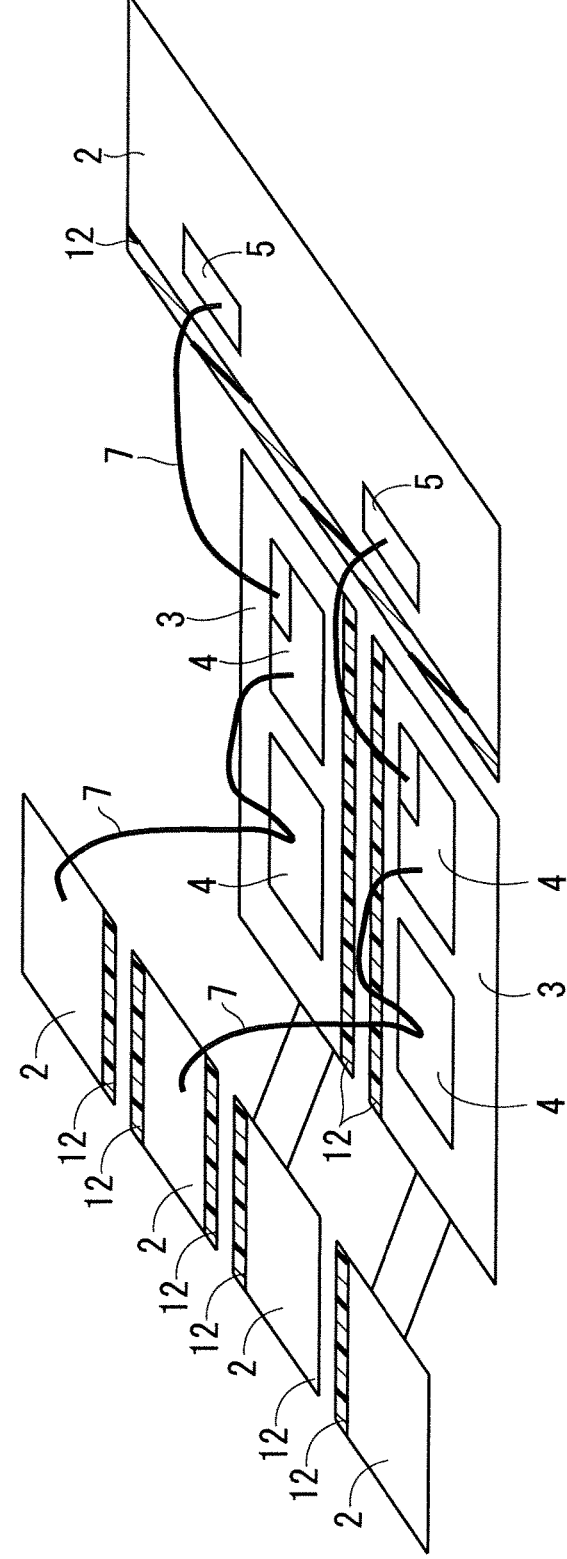

F I G. 7
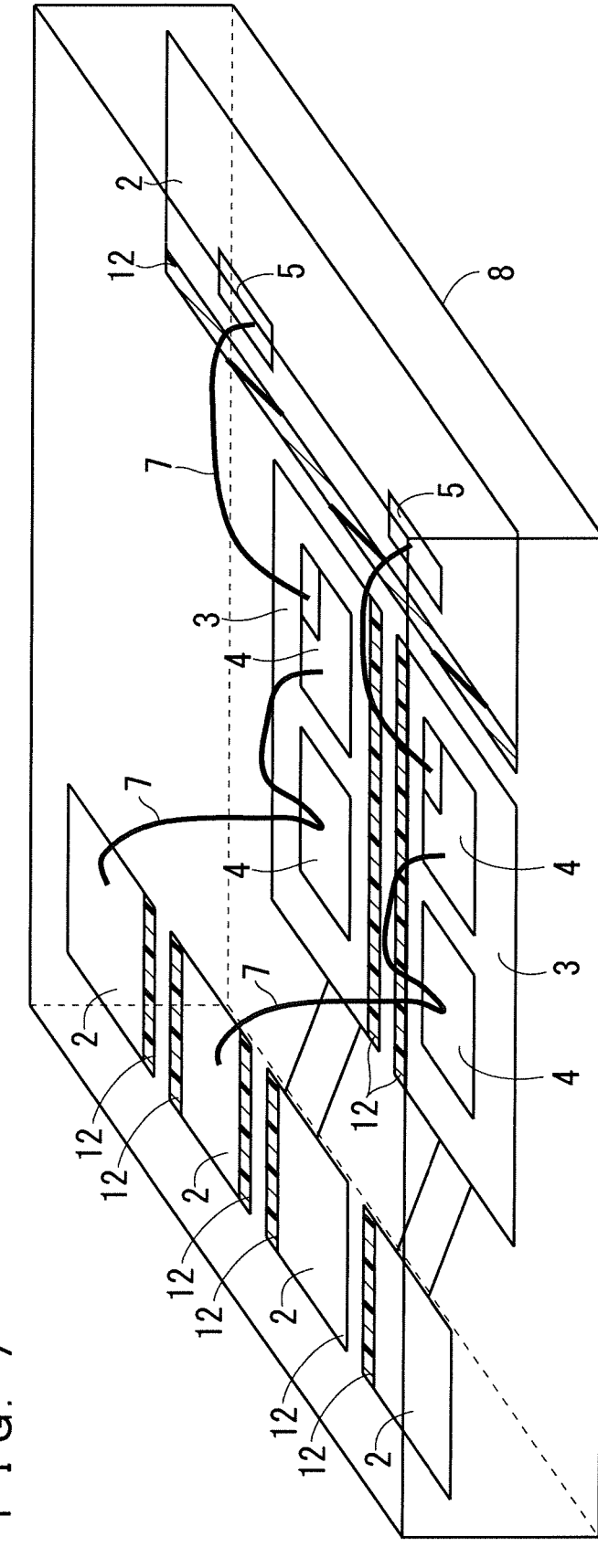

F I G.  8
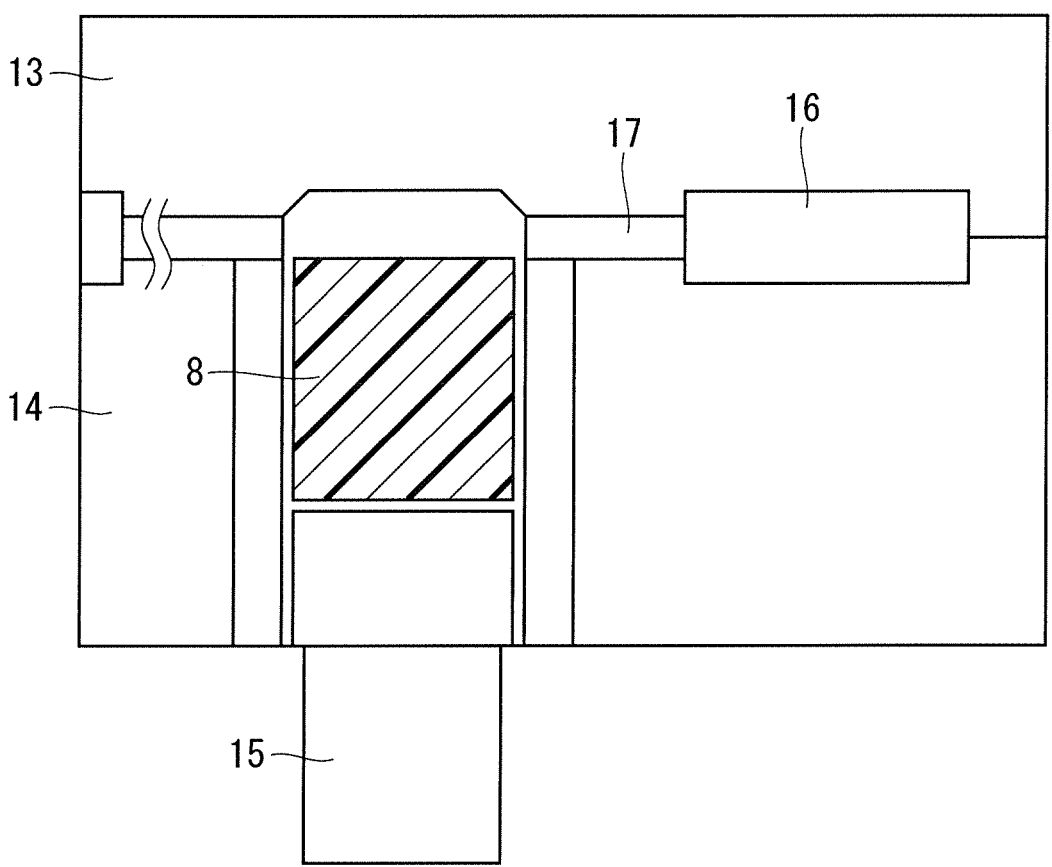

F I G.  9
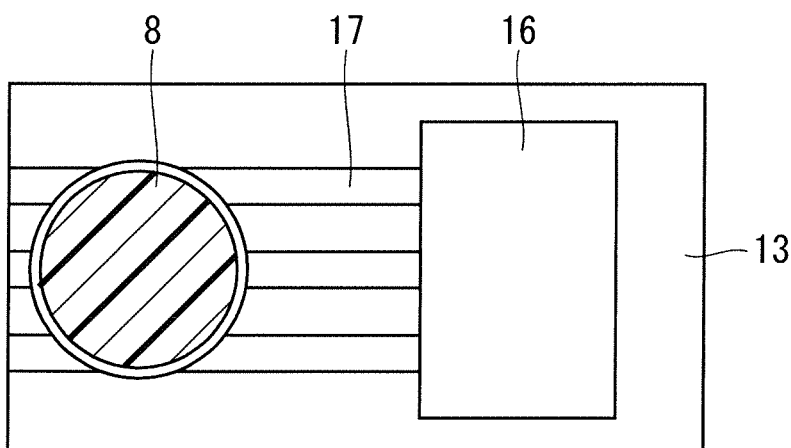

F I G.  1 0
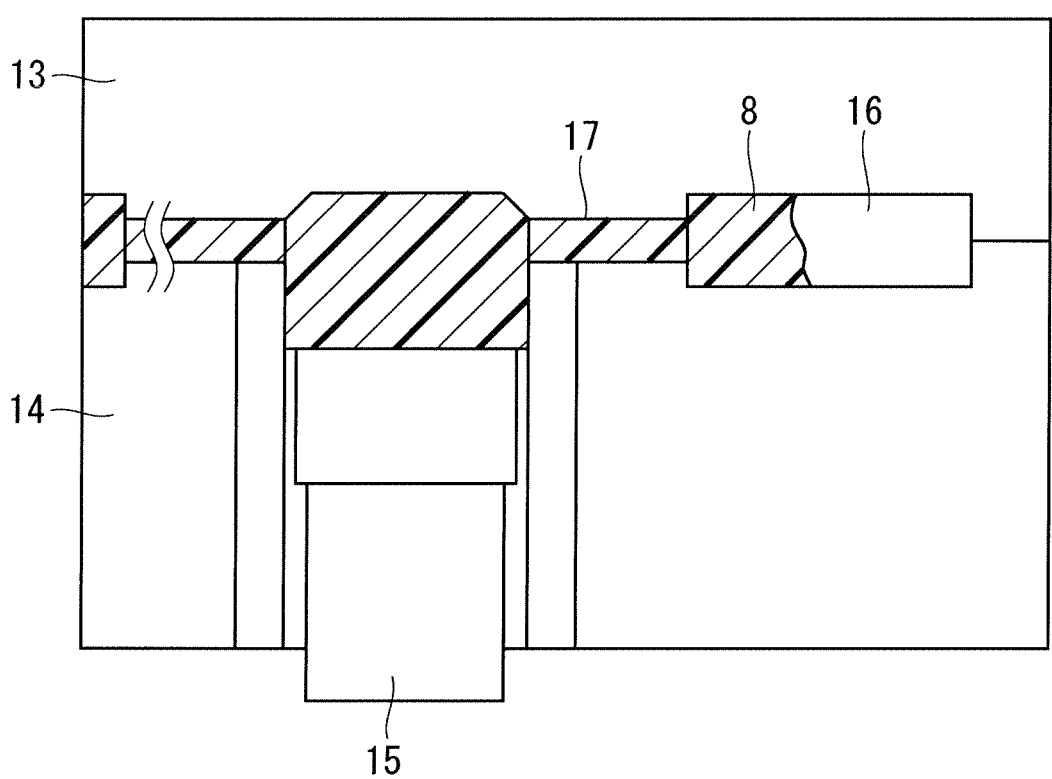

F I G.  1 1
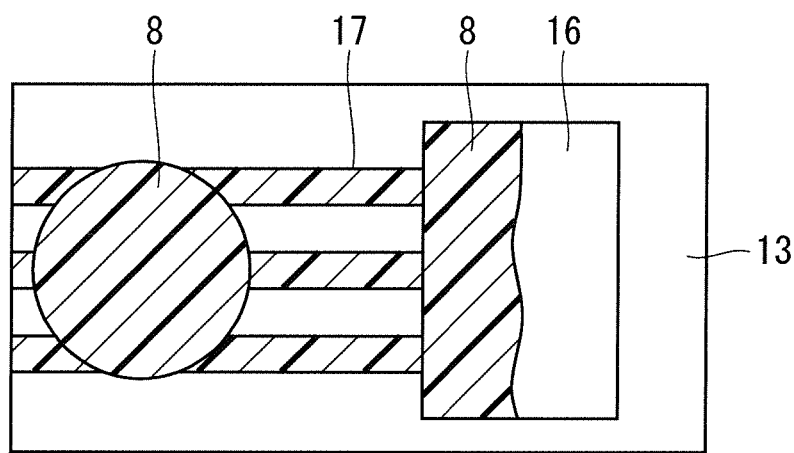

F I G. 1 2

F I G. 1 3

F I G. 1 4

SEMICONDUCTOR DEVICE AND METHOD FOR MANUFACTURING THE SAME

BACKGROUND OF THE INVENTION

Field of the Invention

The present disclosure relates to a semiconductor device and a method for manufacturing the same.

Description of the Background Art

A conventional semiconductor device includes a lead frame having a shape disclosed in, for example, Japanese Patent Application Laid-Open No. 2004-63688.

A semiconductor device, before transfer molding, that is, before a part of a lead frame is covered with an insulating sealing resin, is in a state where respective components, such as the lead frame and a metal wire, are exposed. Therefore, the conventional semiconductor device has had a problem that deformation of the lead frame, deformation of the metal wire, breakage of a metal wire bonding portion due to vibration, or the like may occur when handled in its manufacturing steps. When such deformation or breakage occurs, a short circuit may occur between different electrodes, resulting in a challenge to quality assurance of the semiconductor device.

A mold resin to be used in the transfer molding generally contains epoxy as a main component, and is a black opaque resin for heat resistance and a reduction in internal stress. Therefore, it has been difficult to confirm the above deformation or breakage after the transfer molding, and it has taken a lot of verification time to select a defective product and a deteriorated product.

As described above, the conventional semiconductor device has room for improvement in quality.

SUMMARY

An object of the present disclosure is to provide a semiconductor device capable of improving quality and a method for manufacturing the same.

A semiconductor device according to the present disclosure includes: a lead frame having a plurality of die pad portions electrically independent from each other; a semiconductor element provided on each of the die pad portions; a wire electrically connecting the semiconductor element and the lead frame; an epoxy-based resin provided on at least a part of the lead frame; and a sealing resin covering at least each of the die pad portions, the semiconductor element, the wire, and the epoxy-based resin.

According to the present disclosure, quality of the semiconductor device can be improved.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a schematic view illustrating an example of an external appearance of a semiconductor device according to a first preferred embodiment;

FIG. 2 is a cross-sectional view taken along line A-A of FIG. 1;

FIG. 4 is a view for explaining a step of coating an epoxy-based liquid resin according to the first preferred embodiment;

FIGS. 5 to 7 are views each illustrating an example of a manufacturing step of the semiconductor device according to the first preferred embodiment;

FIG. 8 is a cross-sectional view illustrating an example of a configuration of a molding apparatus according to the first preferred embodiment;

FIG. 9 is a top view illustrating the example of the configuration of the molding apparatus according to the first preferred embodiment;

FIG. 10 is a cross-sectional view illustrating an example of the configuration of the molding apparatus according to the first preferred embodiment;

FIG. 11 is a top view illustrating the example of the configuration of the molding apparatus according to the first preferred embodiment;

FIG. 12 is a view illustrating an example of a configuration of a semiconductor device according to a second preferred embodiment;

FIG. 13 is a view illustrating an example of a configuration of a semiconductor device according to a third preferred embodiment; and FIG. 14 is a cross-sectional view illustrating an example of a configuration of a semiconductor device according to a fourth preferred embodiment.

DESCRIPTION OF THE PREFERRED EMBODIMENTS

First Preferred Embodiment

<Configuration>

Figure 1:
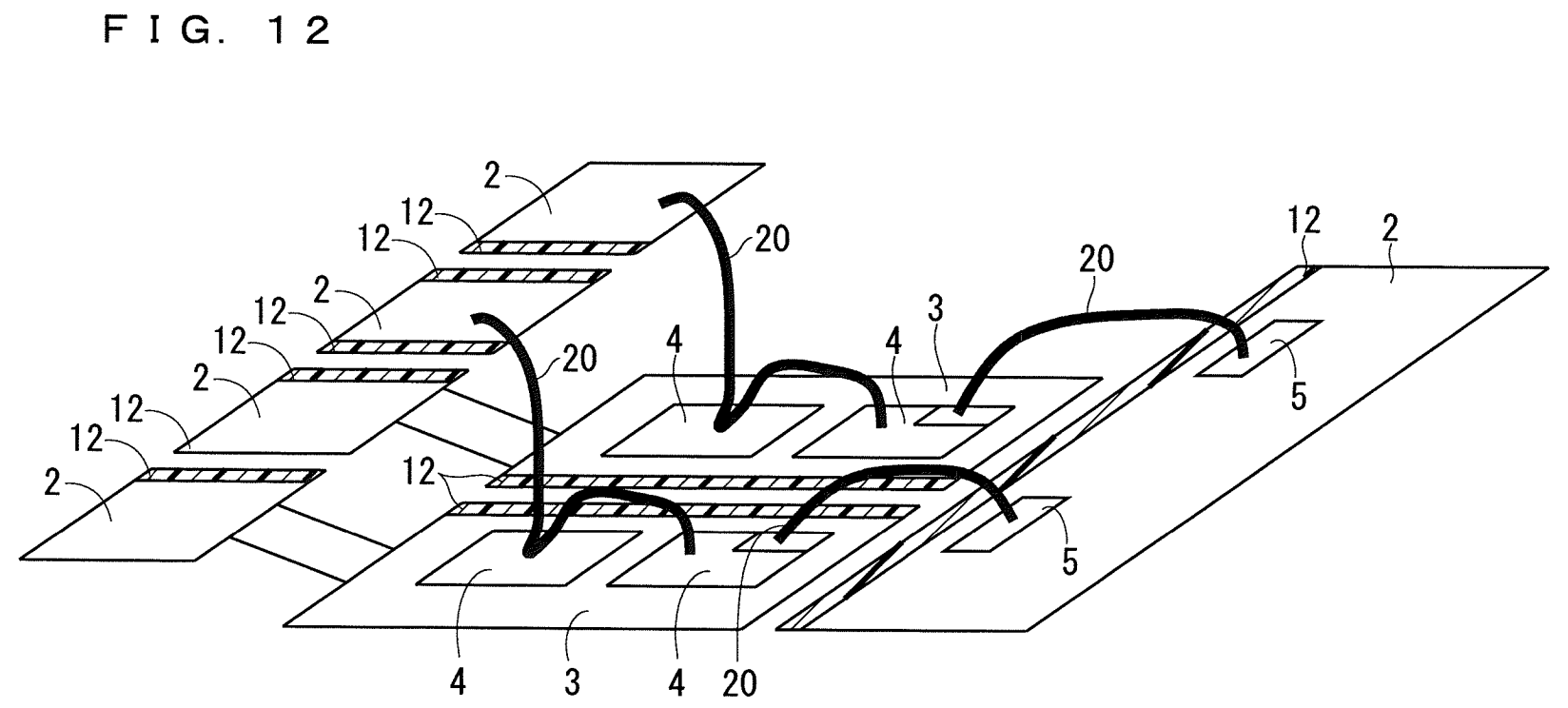
Figure 1:
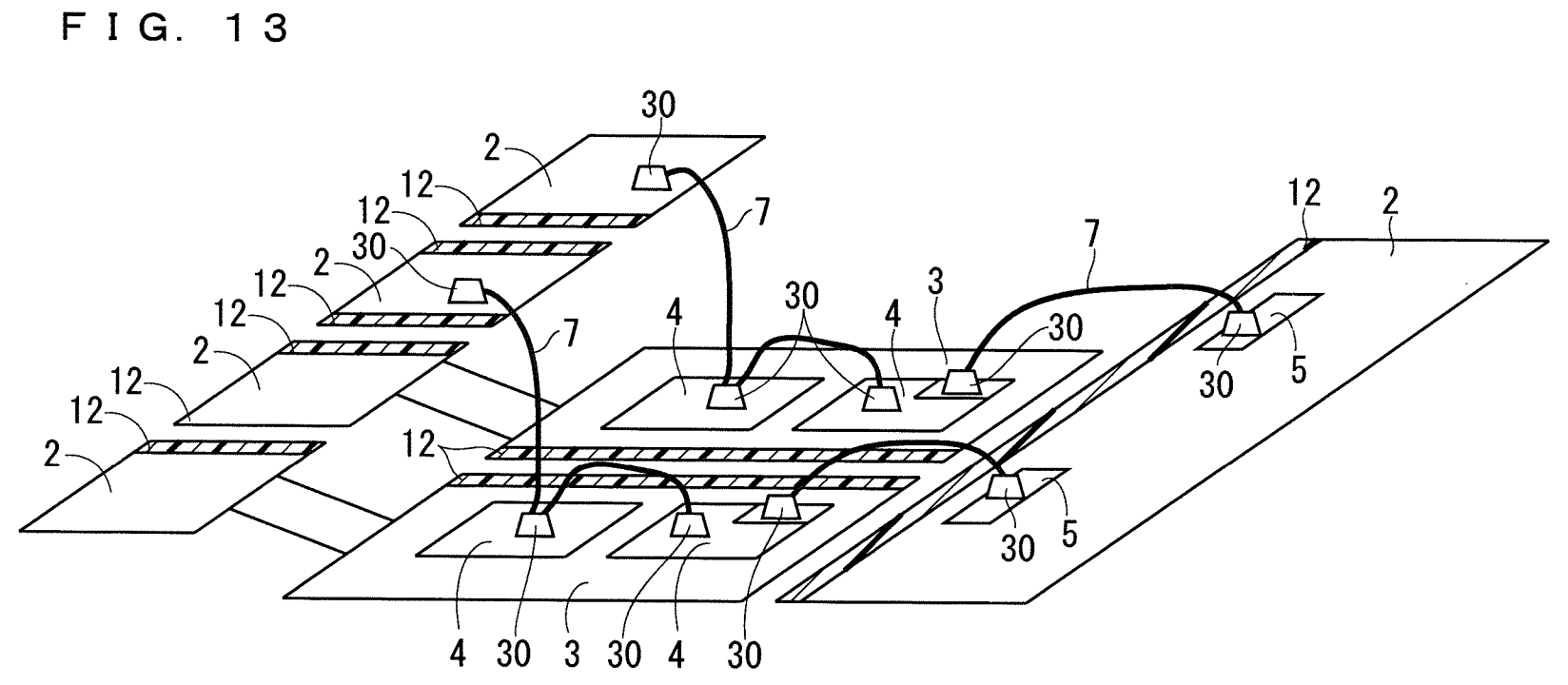
Figure 1:
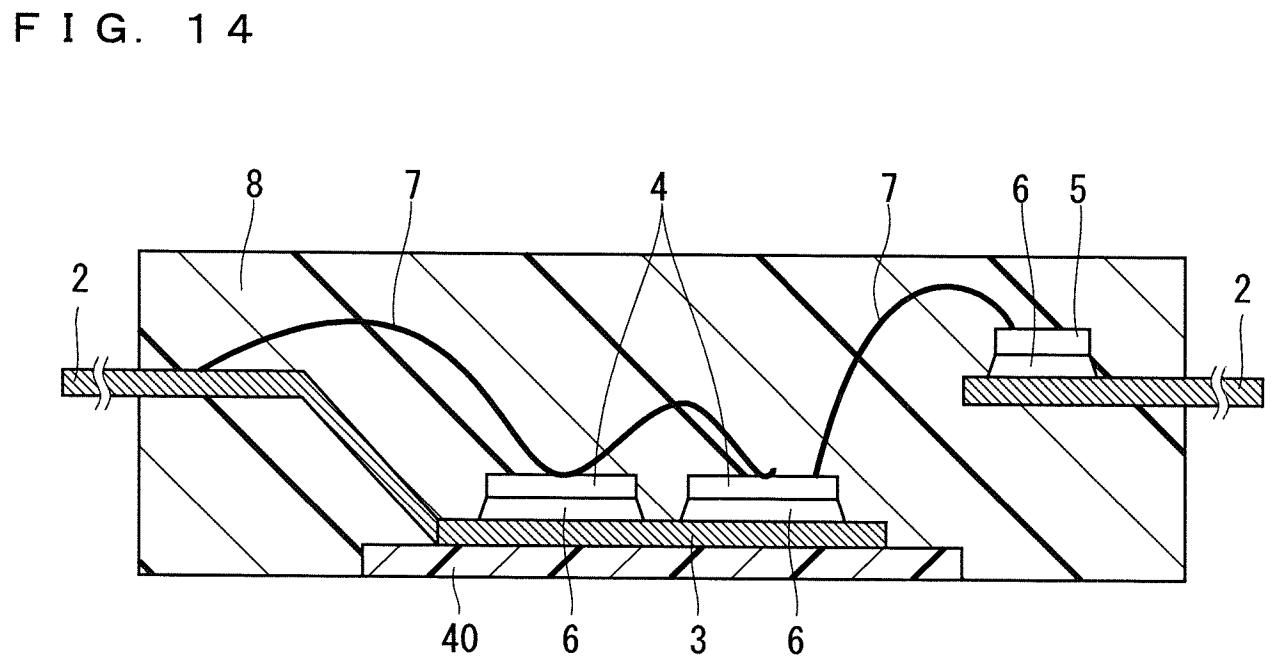
Figure 3:
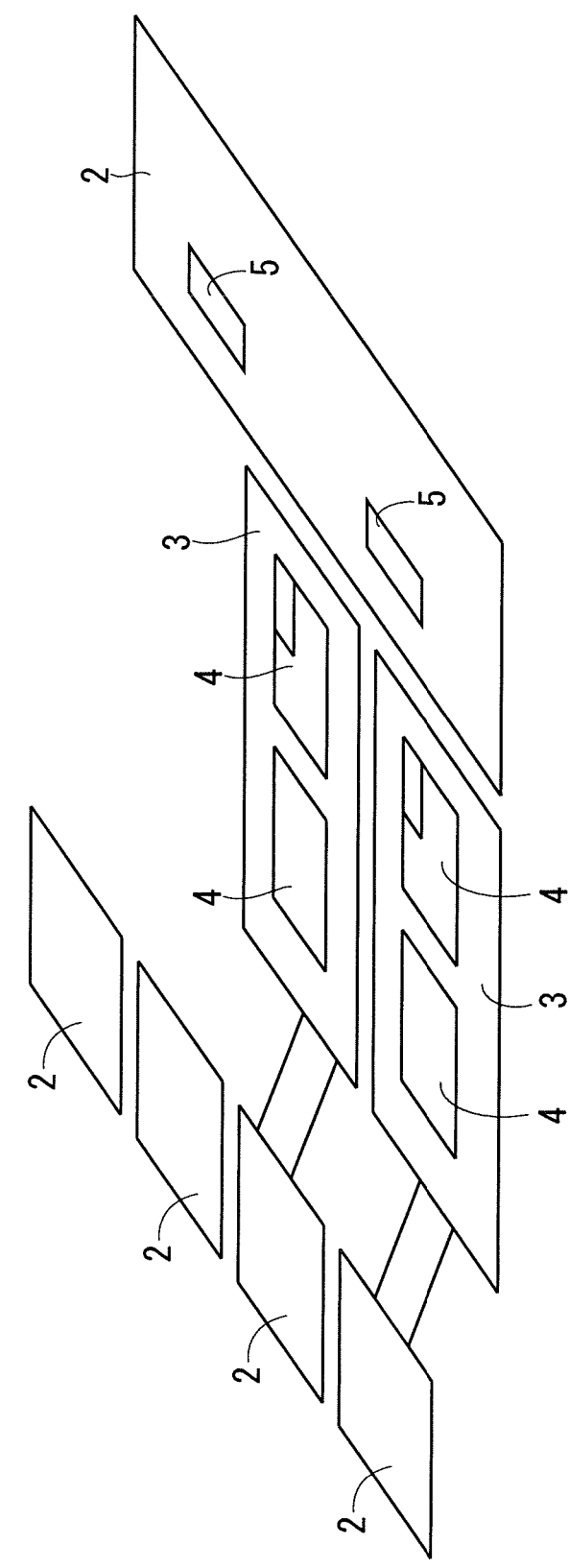
FIG. 3 is a view illustrating an example of a manufacturing step of the semiconductor device according to the first preferred embodiment.

FIG. 1 is a schematic view illustrating an example of an external appearance of a semiconductor device 1 according to a first preferred embodiment. FIG. 2 is a cross-sectional view taken along line A-A of FIG. 1.

As illustrated in FIG. 2, the semiconductor device 1 includes a lead frame 2, a die pad portion 3, a power semiconductor element 4, an IC chip 5, a bonding material 6, a metal wire 7, a mold resin 8 (sealing resin), an insulating layer 9, a heat dissipation layer 10, and an epoxy-based liquid resin 12 (epoxy-based resin). Note that, in FIG. 2, the epoxy-based liquid resin 12 is not illustrated.

The lead frame 2 includes a plurality of the die pad portions 3 as illustrated, for example, in FIG. 3. Each of the die pad portions 3 is electrically independent. On each of the die pad portions 3, the power semiconductor element 4 is provided via the bonding material 6. In the example of FIG. 2, two power semiconductor elements 4 are provided on one die pad portion 3. The power semiconductor element 4 is, for example, a metal oxide semiconductor field effect transistor (MOSFET) or an insulated gate bipolar transistor (IGBT).

The power semiconductor element 4 is electrically connected to the other power semiconductor element 4 provided on the same die pad portion 3 by the metal wire 7. The power semiconductor element 4 is also electrically connected, by the metal wire 7, to the lead frame 2 protruding outward from one surface of the mold resin 8.

The IC chip 5 is provided, via the bonding material 6, on the lead frame 2 protruding outward from the other surface of the mold resin 8. Here, the other surface of the mold resin 8 means a surface facing the one surface of the mold resin 8. The IC chip 5 is electrically connected to the other power semiconductor element 4 by the metal wire 7.

The insulating layer 9 is provided on a back surface of the die pad portion 3. The heat dissipation layer 10 is provided on a back surface of the insulating layer 9.

The mold resin 8 is provided to cover (seal) a part of the lead frame 2, the die pad portions 3, the power semiconductor elements 4, the IC chip 5, the metal wires 7, the insulating layer 9, and a part of the heat dissipation layer 10. The heat dissipation layer 10 is exposed on a part of the back surface of the mold resin 8. The mold resin 8 has an insulating property.

<Manufacturing Method>

FIGS. 3 to 7 are views each illustrating an example of a manufacturing step of the semiconductor device 1. Note that, in FIGS. 3 to 7, the insulating layer 9 and the heat dissipation layer 10 are not illustrated.

First, the power semiconductor element 4 is provided on the die pad portion 3 and the IC chip 5 is provided on the lead frame 2, as illustrated in FIG. 3.

Next, the upper surface of the end portion of the lead frame 2, including the die pad portion 3 is coated with the epoxy-based liquid resin 12, as illustrated in FIGS. 4 and 5. Specifically, the upper surfaces of the end portions of the lead frame 2 and the die pad portion 3 illustrated in FIG. 5 are coated with the epoxy-based liquid resin 12, by using a syringe 11 illustrated in FIG. 4. The epoxy-based liquid resin 12 cures after being applied to form an insulating layer. Note that the coefficient of linear expansion of the epoxy-based liquid resin 12 is set to 15 to 18 [$\times 10^{-6}$/° C.] in consideration of the coefficient of linear expansion of the mold resin 8, but the former coefficient of linear expansion is not limited thereto. In addition, an epoxy-based liquid resin curable at room temperature or constant temperature is adopted as the epoxy-based liquid resin 12.

The syringe 11 is included in a non-illustrated epoxy-based liquid resin coating apparatus. The epoxy-based liquid resin coating apparatus can move the syringe 11 in any of an X-direction, a Y-direction, and a Z-direction, so that the epoxy-based liquid resin 12 can be applied at any position. Note that the drive method of the syringe 11 and the discharge method of the epoxy-based liquid resin 12 are not particularly limited.

Next, the two power semiconductor elements 4 provided on the same die pad portion 3 are connected by the metal wire 7, the power semiconductor element 4 and the lead frame 2 are connected by the metal wire 7, and the power semiconductor element 4 and the IC chip 5 are connected by the metal wire 7, as illustrated in FIG. 6.

Next, the mold resin 8 is provided to cover a part of the lead frame 2, the die pad portions 3, the power semiconductor elements 4, the IC chips 5, the metal wires 7, and the epoxy-based liquid resin 12, as illustrated in FIG. 7.

Transfer molding using the mold resin 8 is performed by using a molding apparatus illustrated, for example, in FIGS. 8 to 11. The molding apparatus includes an upper mold 13, a lower mold 14, a plunger 15, a cavity 16, and a gate 17. The cavity 16 has a shape corresponding to the outer shape of the semiconductor device 1.

As illustrated in FIGS. 8 and 9, a pot (space surrounded by the lower mold 14 and the plunger 15) is filled with the mold resin 8. The lead frame 2 in the state illustrated in FIG. 6 is placed in the cavity 16. Note that, in FIGS. 8 to 11, the lead frame 2 is not illustrated. As illustrated in FIGS. 10 and 11, the mold resin 8 is melted by the heat of the upper mold 13 and the lower mold 14, and is injected into the cavity 16 through the gate 17 as the plunger 15 rises. As a result, the semiconductor device after the molding illustrated in FIG. 7 is obtained. Thereafter, the semiconductor device 1 illustrated in FIG. 1 is obtained through the steps of: cutting out the semiconductor device from the lead frame 2; bending a portion corresponding to the terminal of the lead frame 2; and the like.

<Effects>

Conventionally, there has been a problem that deformation of a lead frame, deformation of a metal wire, or the like may occur when handled in the steps after the wiring of metal wires through transfer molding, resulting in a short circuit between different electrodes.

On the other hand, in the first preferred embodiment, the upper surfaces of the end portions of the lead frame 2 and the die pad portion 3 are coated with the epoxy-based liquid resin 12, so that insulation distances can be secured between different electrodes (between the lead frames 2 adjacent, between the die pad portions 3 adjacent, and between the lead frame 2 and the die pad portion 3 adjacent). As a result, the quality of the semiconductor device 1 can be improved.

Although the case, where the upper surfaces of the end portions of the lead frame 2 and the die pad portion 3 are coated with the epoxy-based liquid resin 12, has been described above, the same effects can be obtained even when the side surfaces of the lead frame 2 and the die pad portion 3 are coated with the epoxy-based liquid resin 12. Note that the epoxy-based liquid resin 12 may be provided on at least either the upper surfaces of the end portions or the side surfaces of the lead frame 2 and the die pad portion 3.

Second Preferred Embodiment

<Configuration and Manufacturing Method>

FIG. 12 is a cross-sectional view illustrating an example of a configuration of a semiconductor device according to a second preferred embodiment. The semiconductor device according to the second preferred embodiment is characterized by including a metal wire 20 provided, on its surface, with an epoxy-based liquid resin (epoxy-based resin). Since other configurations are similar to those of the semiconductor device 1 according to the first preferred embodiment, detailed description thereof is omitted here. Note that, in FIG. 12, the mold resin 8, the insulating layer 9, and the heat dissipation layer 10 are not illustrated.

An epoxy-based liquid resin coating apparatus moves the syringe 11 in any of the X-direction, the Y-direction, and the Z-direction, and coats the surface of the metal wire 7 illustrated, for example, in FIG. 6 with the epoxy-based liquid resin. The metal wire 20 can be obtained after the epoxy-based liquid resin coating the surface of the metal wire 7 cures.

<Effects>

By coating the metal wire with the epoxy-based liquid resin, the metal wire can be reinforced against deformation. In the semiconductor device including the metal wire 20, it is possible to prevent breakage of a metal wire bonding portion due to vibration that is a problem with the material of a metal wire whose diameter is, for example, 100 μm or less. As a result, the semiconductor device according to the second preferred embodiment can be improved in quality more than the semiconductor device according to the first preferred embodiment.

Third Preferred Embodiment

<Configuration and Manufacturing Method>

FIG. 13 is a cross-sectional view illustrating an example of a configuration of a semiconductor device according to a third preferred embodiment. The semiconductor device according to the third preferred embodiment is characterized by including an epoxy-based liquid resin 30 in a bonding portion between the metal wire 7 and the lead frame 2, a bonding portion between the metal wire 7 and the power semiconductor element 4, and a bonding portion between the metal wire 7 and the IC chip 5. The bonding portion is also referred to as a stitch. Since other configurations are similar to those of the semiconductor device 1 according to the first preferred embodiment, detailed description thereof is omitted here. Note that, in FIG. 13, the mold resin 8, the insulating layer 9, and the heat dissipation layer 10 are not illustrated.

An epoxy-based liquid resin coating apparatus moves the syringe 11 in any of the X-direction, the Y-direction, and the Z-direction, and coats each of the bonding portions illustrated in FIG. 13 with the epoxy-based liquid resin. The epoxy-based liquid resin 30 is obtained after the epoxy-based liquid resin coating each of the bonding portions cures.

<Effects>

Deformation of a metal wire progresses from the bonding portion of the metal wire as a starting point. By providing the epoxy-based liquid resin 30 in the bonding portions for reinforcement, as illustrated in FIG. 13, deformation of the metal wire can be prevented, and breakage of the bonding portion of the metal wire due to vibration can also be prevented. In addition, it is sufficient to coat only the bonding portions with the epoxy-based liquid resin, so that the epoxy-based liquid resin can be applied without being affected by a variation in the wiring shape of the metal wire. As a result, the semiconductor device according to the third preferred embodiment can be improved in quality more than the semiconductor device according to the first preferred embodiment.

Although the configuration, in which the semiconductor device 1 according to the first preferred embodiment includes the epoxy-based liquid resin 30, has been described above, a configuration may be adopted in which the semiconductor device according to the second preferred embodiment includes the epoxy-based liquid resin 30. In the case of the configuration, the effects of the second preferred embodiment can also be obtained in addition to the above effects of the third preferred embodiment.

Fourth Preferred Embodiment

<Configuration and Manufacturing Method>

FIG. 14 is a cross-sectional view illustrating an example of a configuration of a semiconductor device according to a fourth preferred embodiment. The semiconductor device according to the fourth preferred embodiment is characterized in that an epoxy-based liquid resin 40 is included on the lower surface of the die pad portion 3 and a part of the epoxy-based liquid resin 40 is exposed from the mold resin 8. That is, the semiconductor device according to the fourth preferred embodiment includes the epoxy-based liquid resin 40 instead of the insulating layer 9 and the heat dissipation layer 10 in the semiconductor device 1 according to the first preferred embodiment. Since other configurations are similar to those of the semiconductor device 1 according to the first preferred embodiment, detailed description thereof is omitted here.

The epoxy-based liquid resin 40 is obtained by performing a surface treatment on a filler as a part of the contained substances to improve thermal conductivity. The thermal conductivity of the epoxy-based liquid resin 40 is 7 [W/m·K] or more.

<Effects>

In the semiconductor device 1 including the insulating layer 9 and the heat dissipation layer 10 that has been described in the first preferred embodiment, there has been a problem that the adhesion at the interface between the die pad portion 3 of the lead frame 2 and the insulating layer 9 decreases, which is a contradiction to achieve the characteristics. On the other hand, in the semiconductor device according to the fourth preferred embodiment, the epoxy-based liquid resin 40 having high thermal conductivity is used, so that the epoxy-based liquid resin 40 in a liquid state improves the adhesion between the die pad portion 3 and the epoxy-based liquid resin 40. As a result, the quality of the semiconductor device can be improved.

In addition, the materials, respectively making up the insulating layer 9 and the heat dissipation layer 10, have high manufacturing costs and manufacturing difficulties due to the required characteristics, which are expensive materials in the semiconductor device. When the epoxy-based liquid resin 40 is used instead of the insulating layer 9 and the heat dissipation layer 10, as in the semiconductor device according to the fourth preferred embodiment, the number of materials is reduced, so that the manufacturing cost of the semiconductor device can be reduced.

In the above description, a configuration has been described in which the epoxy-based liquid resin 40 is included instead of the insulating layer 9 and the heat dissipation layer 10 in the semiconductor device 1 according to the first preferred embodiment, but the present disclosure is not limited thereto. A configuration may be adopted in which the epoxy-based liquid resin 40 is included instead of, for example, the insulating layer 9 and the heat dissipation layer 10 in the semiconductor device according to the second or third preferred embodiment. In the case of this configuration, the effects of the second or third preferred embodiment can also be obtained in addition to the above effects of the fourth preferred embodiment. Alternatively, the epoxy-based liquid resin 40 may be provided only on the lower surface of the die pad portion 3 without providing the epoxy-based liquid resin 12 on the surfaces of the lead frame 2 and the die pad portion 3 as in the first to third preferred embodiments.

Note that, within the scope of the present disclosure, respective preferred embodiments can be freely combined, or each preferred embodiment can be appropriately modified or omitted.

While the disclosure has been shown and described in detail, the foregoing description is in all aspects illustrative and not restrictive. It is therefore understood that numerous modifications and variations can be devised.

What is claimed is:

1. A semiconductor device comprising:
a lead frame having a plurality of die pad portions electrically independent from each other;
a plurality of semiconductor elements provided on upper surfaces of corresponding ones of the die pad portions;
a plurality of wires electrically connecting the semiconductor elements and the lead frame;

an epoxy-based resin provided on at least either an upper surface of an end portion or a side surface of the lead frame, the epoxy-based resin being entirely spaced from each of the semiconductor elements; and a sealing resin covering at least each of the die pad portions, the semiconductor elements, the wires, and the epoxy-based resin, wherein the epoxy-based resin includes separate portions connected to respective ones of the die pad portions, and a portion of the sealing resin is positioned between the separate portions of the epoxy-based resin.

2. The semiconductor device according to claim 1, wherein the epoxy-based resin is provided on a lower surface of each die pad portion, and at least a part of the epoxy-based resin is exposed from the sealing resin.

3. The semiconductor device according to claim 2, wherein the epoxy-based resin has a thermal conductivity of 7 W/m·K or more.

4. The semiconductor device according to claim 1, wherein the epoxy-based resin is provided on a surface of the wires.

5. The semiconductor device according to claim 1, wherein the epoxy-based resin is provided on a first portion of one of the wires connected to the lead frame and on a second portion of the lead frame connected to the first portion, and another epoxy-based resin is provided on a third portion of one of the wires connected to one of the semiconductor elements and on a fourth portion of the one of the semiconductor elements connected to the third portion.

6. The semiconductor device according to claim 1, further comprising an insulating layer on a back surface of the die pad portions.

7. A method for manufacturing a semiconductor device, the method comprising:

a first step of preparing a lead frame having a plurality of die pad portions electrically independent from each other;

a second step of providing a plurality of semiconductor elements on upper surfaces of corresponding ones of the die pad portions;

a third step of providing an epoxy-based resin on at least either an upper surface of an end portion or a side surface of the lead frame, the epoxy-based resin being entirely spaced from each of the semiconductor elements;

a fourth step of electrically connecting the semiconductor elements and the lead frame with a plurality of wires; and a fifth step of covering at least each of the die pad portions, the semiconductor elements, the wires, and the epoxy-based resin with a sealing resin, wherein the epoxy-based resin includes separate portions connected to respective ones of the die pad portions, and a portion of the sealing resin is positioned between the separate portions of the epoxy-based resin.

8. The method for manufacturing a semiconductor device according to claim 7, wherein, in the third step, the epoxy-based resin is provided on a lower surface of each die pad portion such that at least a part of the epoxy-based resin is exposed from the sealing resin.

9. The method for manufacturing a semiconductor device according to claim 8, wherein the epoxy-based resin has a thermal conductivity of 7 W/m·K or more.

10. The method for manufacturing a semiconductor device according to claim 7, the method further comprising a sixth step of providing the epoxy-based resin on a surface of the wires between the fourth step and the fifth step.

11. The method for manufacturing a semiconductor device according to claim 7, wherein, in the third step, the lead frame is coated with the epoxy-based resin by an epoxy-based liquid resin coating apparatus.

12. The method for manufacturing a semiconductor device according to claim 7, wherein the epoxy-based resin is an epoxy-based liquid resin.

13. The method for manufacturing a semiconductor device according to claim 7, wherein an insulating layer is provided on a back surface of the die pad portions.

14. The method for manufacturing a semiconductor device according to claim 7, wherein the fourth step is performed after the third step.

* * * * *